United States Patent
Wohl et al.

(10) Patent No.: US 6,247,165 B1
(45) Date of Patent: Jun. 12, 2001

(54) SYSTEM AND PROCESS OF EXTRACTING GATE-LEVEL DESCRIPTIONS FROM SIMULATION TABLES FOR FORMAL VERIFICATION

(75) Inventors: Peter Wohl, Williston, VT (US); Demosthenes Anastasakis, Beaverton, OR (US)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 09/533,649

(22) Filed: Mar. 22, 2000

Related U.S. Application Data

(63) Continuation-in-part of application No. 09/052,998, filed on Mar. 31, 1998, now Pat. No. 6,148,436.

(51) Int. Cl.$^7$ ................................................... G06F 17/50
(52) U.S. Cl. ................................... 716/5; 716/3; 716/21
(58) Field of Search ..................................................... 716/5

(56) References Cited

U.S. PATENT DOCUMENTS

| | | | |
|---|---|---|---|
| 5,243,538 | 9/1993 | Okuzawa et al. | 364/489 |
| 5,295,164 | * 3/1994 | Yamamura | 375/120 |

(List continued on next page.)

OTHER PUBLICATIONS

Mukherjee et al., Efficient Combinatorial Verification Using BDDs and a Hash Table, 1997 IEEE International Symposium on Circuits and Systems, pp. 1025–1028, Jun. 1997.*

S. B. Akers, "Binary Decision Diagrams", IEEE Transactions on Computers, 1978.

P. Lindgren, "Improved Computational Methods and Lazy Evaluation of the Ordered Ternary Decision Diagram", Division of Computer Engineering, Lulea Sweden, pp. 379–384.

G. Jennings, "Symbolic Incompletely Specified Functions for Correct Evaluation in the Presence of Interdeterminate Input Values", Division of Computer Engineering, Lulea Sweden, IEEE 95, pp. 23–31.

(List continued on next page.)

*Primary Examiner*—Matthew Smith
*Assistant Examiner*—A. M. Thompson
(74) *Attorney, Agent, or Firm*—Wagner, Murabito & Hao LLP

(57) ABSTRACT

A system and method for generating gate level descriptions tables from simulation for formal verification. Implementation libraries contain table-based descriptions of user defined primitives (UDPs), various-strength primitives, hierarchical structural cells and non-functional constructs, such as timing and simulation assertion checks. In order to use the library cells for use by test-generation (ATPG) and formal verification (FV), the present invention provides a library reader and a model builder that read in the library cells and construct gate-level models usable by ATPG processes. The present invention also provides a translator that accesses the ATPG models through an API (Application Programming Interface) interface and produces FV models that are usable by FV processes. Significantly, according to the present invention, the FV models are generated based on the ATPG models. Library cell complexities that would require different ATPG and FV models are automatically detected. Consequently, the single, common model is augmented with a few bits of extra information, or, in some cases, changed in a plurality of ways to accommodate different requirements of ATPG and FV.

21 Claims, 12 Drawing Sheets

U.S. PATENT DOCUMENTS

| | | | | |
|---|---|---|---|---|
| 5,331,568 | * | 7/1994 | Pixley | 364/489 |
| 5,491,639 | | 2/1996 | Filkorn | 364/488 |
| 5,493,508 | | 2/1996 | Dangelo et al. | 364/489 |
| 5,623,419 | * | 4/1997 | Kundert | 364/490 |
| 5,629,858 | * | 5/1997 | Kundu et al. | 364/488 |
| 5,649,165 | * | 7/1997 | Jain et al. | 395/500 |
| 5,754,454 | * | 5/1998 | Pixley et al. | 364/580 |
| 5,764,525 | * | 6/1998 | Mahmood et al. | 364/488 |
| 5,805,462 | | 9/1998 | Poirot et al. | 364/490 |
| 5,920,490 | * | 7/1999 | Peters | 364/578 |
| 5,956,497 | * | 9/1999 | Ratzel et al. | 395/500.02 |
| 5,991,523 | * | 11/1999 | Williams et al. | 395/500.19 |
| 6,035,107 | * | 3/2000 | Kuehlmann et al. | 395/500.02 |
| 6,086,626 | * | 7/2000 | Jain et al. | 716/5 |
| 6,099,580 | * | 8/2000 | Boyle et al. | 716/7 |
| 6,102,964 | * | 8/2000 | Tse et al. | 716/18 |

OTHER PUBLICATIONS

G. Jennings et al., "Ordered Ternary Decision Diagrams and the Multivalued Compiled Simulation of Unmapped Logic", Division of Computer Engineering, Lulea Sweden, IEEE 94, pp. 99–105.

G. Jennings, "Accurate Ternary–Valued Compiled Logic Simulation of Complex Logic Networks by OTDD Composition", Division of Computer Engineering, Lulea Sweden, IEEE 95, pp. 303–310.

R. Bryant, "Binary Decision Diagrams and Beyond: Enabling Technologies for Formal Verification", Carnegie Mellon University, Pittsburgh, PA 15213, pp. 1–8.

R. Rudell, "Dynamic Variable Ordering for Orderee Binary Decision Diagrams", Synopsys, Inc., Mtn. View, CA 94043, IEEE 93, pp. 42–47.

R. Bryant et al., "Verification of Arithmetic Circuits with Binary Moment Diagrams", Carnegie Mellon University, Pittsburgh, PA 15213, 95, pp. 535–541.

* cited by examiner

400

```
module strengths ( a, b, c, d, e, f, g, q);
input a, b, c, d, e, f, g; output q;
  tri w9, w12;
    nmos n8 (w9, c, d);
    rnmos r7 (w9, a,b);
    nmos n10 (w12, w9, e);
    nmos n11 (w12, f, g);
    not n13 (q, w12);
endmodule
```

FIGURE 4

SYSTEM AND PROCESS OF EXTRACTING GATE-LEVEL DESCRIPTIONS FROM SIMULATION TABLES FOR FORMAL VERIFICATION

RELATED CASE

The instant application is a continuation-in-part application of U.S. patent application Ser. No., 09/052,998, filed Mar. 31, 1998, now U.S. Pat. No. 6,148,436, entitled "System and Method For Automatic Generation of Gate-Level Descriptions From Table-Based Descriptions For Electronic Design Automation", by Peter Wohl, assigned to Synopsys, Inc., now U.S. Pat. No. 6,148,436 which is hereby incorporated by reference.

FIELD OF THE INVENTION

The present invention relates to the field of electronic design automation (EDA). More specifically, the present invention relates to techniques for producing gate-level and structural descriptions used in a computer controlled EDA system for integrated circuit (IC) design.

BACKGROUND OF THE INVENTION

An electronic design automation (EDA) system is a form of computer aided design (CAD) system and is used for designing integrated circuit (IC) devices. The EDA system typically receives one or more high level behavioral descriptions of an IC device (e.g., in HDL languages like VHDL, Verilog, etc.) and translates this high level design language description into netlists of various levels of abstraction. At a higher level of abstraction, a generic netlist is typically produced based on library primitives. The generic netlist can be translated into a lower level technology-specific netlist based on a technology-specific library. A netlist describes the IC design and is composed of nodes (elements) and edges, e.g., connections between nodes, and can be represented using a directed cyclic graph structure having nodes which are connected to each other with signal lines. The netlist is typically stored in computer readable media within the EDA system and processed and verified using many well known techniques. The netlist may then be used to generate a physical device layout in mask form which can be used to directly implement structures in silicon to realize the physical IC device.

FIG. 1 illustrates a typical design flow 10 for the design of integrated circuits (e.g., ASIC, microprocessors, microcontrollers, etc.). This IC design flow 10 requires several equivalent descriptions of the design library that are used as input to different CAD tools. In the prior art system 10, a set of hand-coded descriptions of low-level design cells is referred to as a "library." For instance, an implementation library 12 and a reference library 22 are shown. Because these libraries 12 and 22 are hand-coded, significant effort is expended in creating these libraries 12 and 22, verifying their equivalence, and maintaining multiple sets of descriptions across various versions of the same IC design. Hand-coding is not only time consuming, but is often error-prone and leads to incomplete modeling. It would be advantageous to reduce the effort required to generate a library within an IC design process to thereby reduce IC design time, reduce cost and increase IC design accuracy.

In typical CAD design flows, the implementation library 12 is the "golden" (sign-off) simulation library upon which the downstream IC design is based. A large percentage of the library development effort is invested in coding and verifying custom or special function cells that cannot be easily represented by traditional gates such as AND, OR, and are naturally encoded as look-up tables. These look-up tables are called table-based descriptions 14 and are stored in the implementation library 12. The tables 14 are created in the target simulator's language; for example user-defined primitive (UDP) tables in Verilog or VITAL tables in VHDL as described in: IEEE Standards Department, "IEEE Standard VHDL Language Reference Manual," IEEE-1076-1987, IEEE, NY, 1988; IEEE Standards Department, "Verilog Hardware Description Language," IEEE-1364, 1994; and IEEE Standards Department, "Standard VITAL ASIC Modeling Specification," IEEE P1076.4, July 1995.

As shown in FIG. 1, the first library 12 may be used for simulation 16a, emulation 16b and verification 16c. However, an equivalent structural "test" library 22 is needed for test generation 20a and formal verification 20b. The structural library 22 is needed because tools such as test generation 20a and formal verification 20b do not directly accept simulation-table models 14. Therefore, the structural test library 22 is created to support test generation processes 20a and formal verification 20b.

The most engineering-time consuming process of the IC design process 10 is manually translating (e.g., hand-coding) the table-based models 14 (akin to truth-tables) from the simulation library 12 into structural models 24 in the test library 22. The manual translation is labor intensive and error prone and involves explicitly instantiating gates and manually connecting the gates into an equivalent structure. Moreover, once the manually generated structural models 24 are generated, they require verifying their logical equivalence 18, which consumes additional design time. It would be advantageous to make the above IC design process 10 more efficient and cost effective.

Accordingly, what is needed is a system and method for reducing the complexity of an IC design process by eliminating and/or increasing the efficiency of one or more steps of the IC design process. What is also needed is a system and method for reducing the amount of hand-coded descriptions required in the IC design process. In view of the above needs, the present invention provides a system and method for increasing the efficiency of an IC design process to thereby provide a faster, more cost effective and more accurate IC design process. These and other advantages of the present invention not specifically mentioned above will become clear within discussions of the present invention presented herein.

SUMMARY OF THE DISCLOSURE

A system and method are described for generating gate level descriptions from simulation tables for formal verification. Implementation libraries contain table-based descriptions of user defined primitives (UDPs), various-strength primitives, hierarchical structural cells and non-functional constructs, such as timing and simulation assertion checks. According to one embodiment, the present invention provides a library reader that is adapted for accessing an implementation library, including UDPs, and translating the implementation library into gate-level descriptions. The present invention also provides a model builder that optimizes and flattens the gate-level descriptions to create ATPG models that can be directly used by ATPG processes. The present invention also provides a translator that maps the primitives of the ATPG models into primitives of FV models that can be directly used by FV processes. Subsequently, the translated implementation library can be formally verified against a reference library. In addition, a gate level design that is based on the original implementation library can be formally verified against a reference design.

In accordance with the present invention, some UDPs can be directly translated into gate-level models that are usable by both ATPG and FV processes. However, for more complex UDPs, ATPG processes and FV processes may have different requirements. In order to create a single, common model that can be shared by both ATPG processes and FV processes, the library reader of the present invention eliminates non-functional circuitry, translates primitive strengths and extracts clock dominance from the UDPs. Further, the model builder propagates tied values and replaces equivalent latches and flip-flops while constructing the ATPG models. Consequently, the single, common model is augmented with a few bits of extra information, or, in some cases, changed in minor ways to accommodate different requirements of ATPG and FV.

For combinational table-based descriptions, the library reader of one embodiment of the present invention utilizes ordered ternary decision diagram (OTDD) graphs with input reordering to extract prime, non-redundant cube sets that can include high level functions (e.g., XOR, XNOR, MUX). For sequential table-based descriptions, a reduced or "clock" based OTDD graph is generated from which data and clock signals are identified and characterized. Input reordering is done and a complete sequential OTDD graph is generated, followed by port separation and characterization of the sequential element (e.g., latch, flip-flop, 2-latches). Clock and data functions are then constructed on a port-by-port basis using the prime, non-redundant cube set generation processes of the combinational logic phase.

Embodiments of the present invention include the above and further include a computer readable medium containing therein computer readable codes that is capable of causing a computer implemented electronic design automation (EDA) system to perform a method of automatically generating gate-level models of circuit cells for use in formal verification. The method of the present embodiment includes the steps of: accessing an implementation library to obtain a table-based description of a circuit cell; constructing a first gate-level model of the circuit based on the table-based description wherein the first gate-level model is adapted for automatic test pattern generation; and translating the first gate-level model into a second gate-level model that is adapted for formal verification.

BRIEF DESCRIPTION OF THE DRAWINGS

The accompanying drawings, which are incorporated in and form a part of this specification, illustrate embodiments of the present invention and, together with the description, serve to explain the principles of the invention.

FIG. 4 illustrates a Verilog description of a circuit (of the Prior Art) that includes Verilog signal strength values that cannot be fully represented by an ATPG model.

DETAILED DESCRIPTION OF THE PREFERRED EMBODIMENTS

Figure 1:
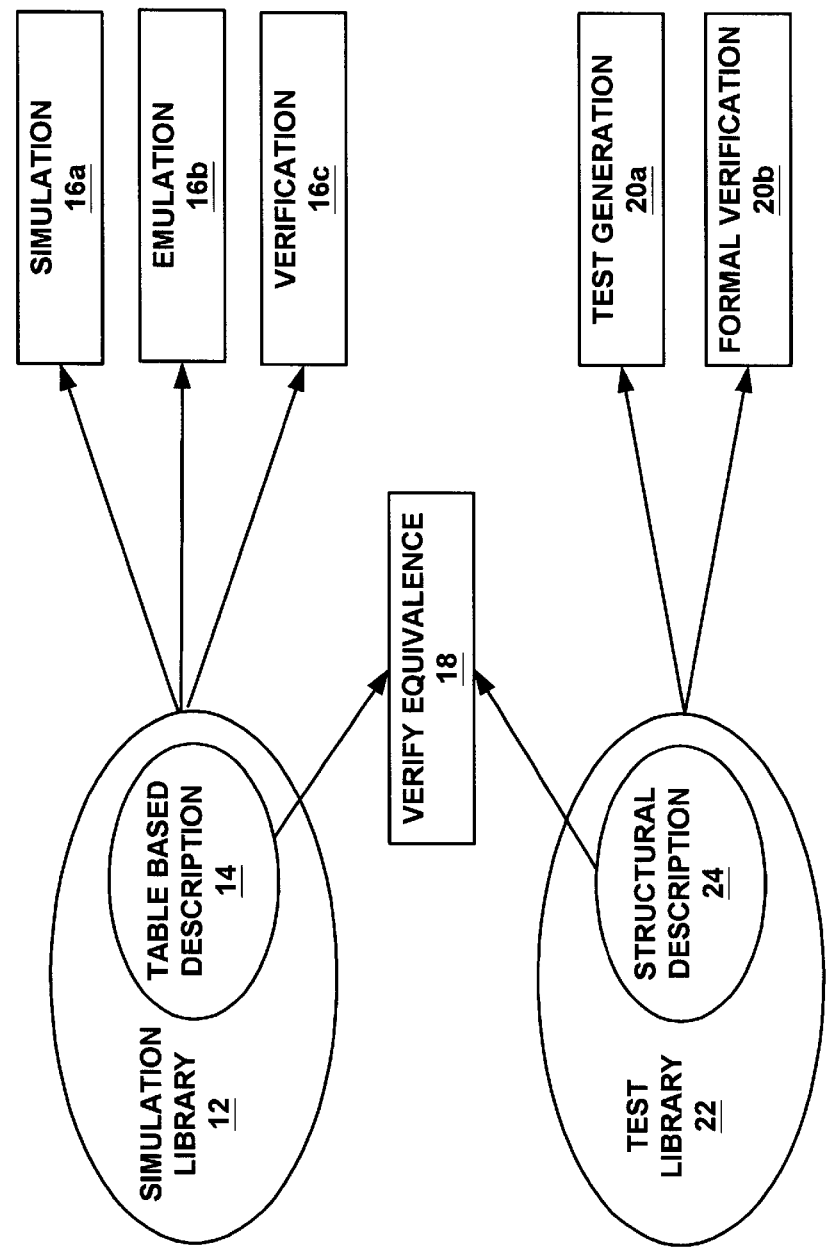
FIG. 1 illustrates a typical prior art integrated circuit (IC) design flow including manual generation of the structural descriptions within a test library and an equivalence verification step.

In the following detailed description of the present invention, a system and method for automatic generation of gate-level descriptions from table-based descriptions within the field of electronic design automation, numerous specific details are set forth in order to provide a thorough understanding of the present invention. However, it will be recognized by one skilled in the art that the present invention may be practiced. without these specific details or with equivalents thereof. In other instances, well known methods, procedures, components, and circuits have not been described in detail as not to unnecessarily obscure aspects of the present invention.

NOTATION AND NOMENCLATURE

Some portions of the detailed descriptions which follow are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "translating" or "calculating" or "determining" or "displaying" or "recognizing" or the like, refer to the action and processes of a computer system (e.g., FIG. 2), or similar electronic computing device, that manipulates and transforms data represented as physical (electronic) quantities within the computer system's registers and memories into other data similarly represented as physical quantities within the computer system memories or registers or other such information storage, transmission or display devices.

COMPUTER SYSTEM PLATFORM 112

Aspects of the present invention, described below, are discussed in terms of steps executed on a computer system (e.g., process 300). These steps are implemented as program code stored in computer readable memory units of a computer system and are executed by the processor of the computer system. Although a variety of different computer systems can be used with the present invention, an exemplary general purpose computer system 112 is shown in FIG. 2.

In general, computer system 112 includes an address/data bus 100 for communicating information, a central processor 101 coupled with the bus for processing information and instructions, a volatile memory 102 (e.g., random access memory RAM) coupled with the bus 100 for storing information and instructions for the central processor 101 and a non-volatile memory 103 (e.g., read only memory ROM) coupled with the bus 100 for storing static information and instructions for the processor 101. Computer system 112 also includes a data storage device 104 ("disk subsystem") such as a magnetic or optical disk and disk drive coupled with the bus 100 for storing information and instructions and a display device 105 coupled to the bus 100 for displaying information to the computer user. Data storage device 104 can include one or more removable magnetic or optical storage media (e.g., diskettes, tapes) which are computer readable memories. Memory units of system 112 include 102, 103 and 104.

Figure 2:
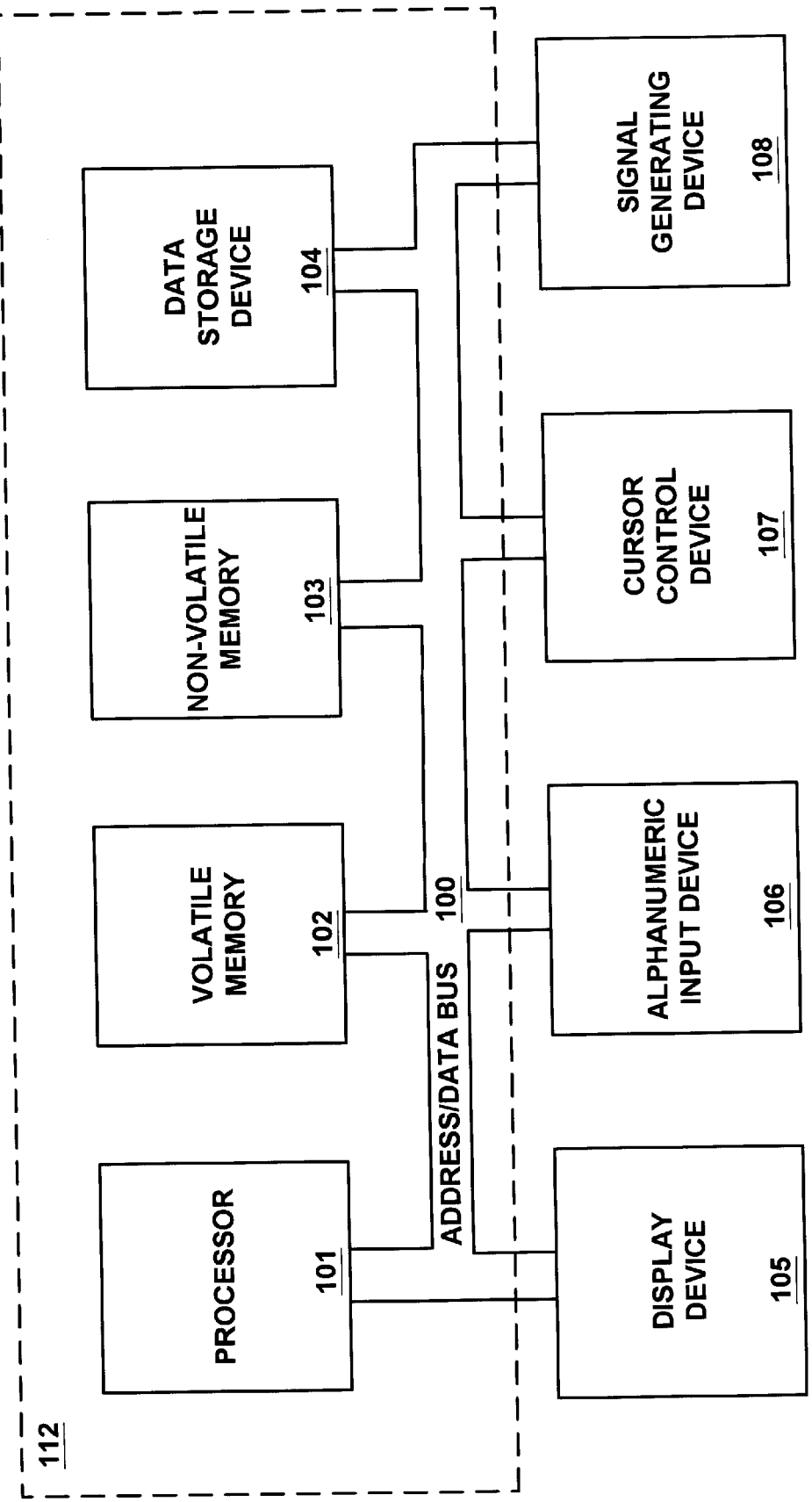
FIG. 2 is a general purpose computer system which provides an operational platform for embodiments of the present invention.

Also included in computer system 112 of FIG. 2 is an alphanumeric input device 106 including alphanumeric and function keys coupled to the bus 100 for communicating information and command selections to the central processor 101. Computer system 112 also includes a cursor control or directing device 107 coupled to the bus for communicating user input information and command selections to the central processor 101. Computer system 112 can also include an optional signal generating device 108 coupled to the bus 100 for interfacing with other networked computer systems. The display device 105 utilized with the computer system 112 of the present invention may be a liquid crystal device, other flat panel display, cathode ray tube, or other display device suitable for creating graphic images and alphanumeric characters recognizable to the user.

PROCESS OF EXTRACTING A GATE-LEVEL DESCRIPTION FROM SIMULATION TABLES FOR FORMAL VERIFICATION ACCORDING TO THE PRESENT INVENTION

In order to formally verify an implementation design against a reference design, a formal verification tool typically needs functional descriptions of the library cells in the implementation libraries and those of the reference libraries. Often, the implementation design is based on an implementation library (or, simulation library), that contains functional, timing and simulation-only information. The process of extracting the functional information from implementation libraries is cumbersome and often impossible.

Automatic test-pattern generation (ATPG) and formal verification (FV) share a common simulation model (also referred to as implementation model), described by netlist and library files. Many library files describe complex combinational and sequential cells as simulation tables, such as Verilog user-defined primitives (UDPs). While tables can be simulated very efficiently, ATPG and FV require a gate-level, structural representation to work on. Therefore, a goal of the present invention is to extract gate level descriptions from simulation tables for both ATPG and FV.

Unfortunately, while "simple" UDPs can be directly translated into gate-level models that are perfectly suited for both ATPG and FV, more complex UDPs require some "creative" translation which results in a model that may be perfect for ATPG, but too pessimistic for FV. Further, ATPG and FV processes have different requirements with respect to the model built. For instance, the model built for ATPG is driven by the following specific requirements: (1) faultable pins must be preserved whenever possible; (2) models are built from library cells and netlist data, and are very large, thus must be optimized to reduce the number of primitives; and (3) library models may be pessimistic if it simplifies the model, e.g., the ATPG model may output X (unknown) when the simulation model outputs a Boolean value (0 or 1). By contrast, the model built for formal verification has different requirements: (1) state elements must be always preserved to obtain an exact correspondence with the reference model; (2) models are built for library cells only, which are usually small, thus size considerations are not important (netlist data is introduced into the FV model after the library cells.); and (3) library models must be exact; pessimism is not allowed.

One way to resolve the aforementioned problem is to directly translate more complex UDPs into one set of gate-level models that are optimized for ATPG and another set that are optimized for FV. However, customizing models separately for ATPG and FV would quickly evolve into two separate implementations and models. A significant effort would have to be expended in writing, maintaining and updating these separate models. Therefore, another goal of the present invention is to provide a method and system of generating a gate-level model that can be used for both ATPG and FV.

Figure 3:
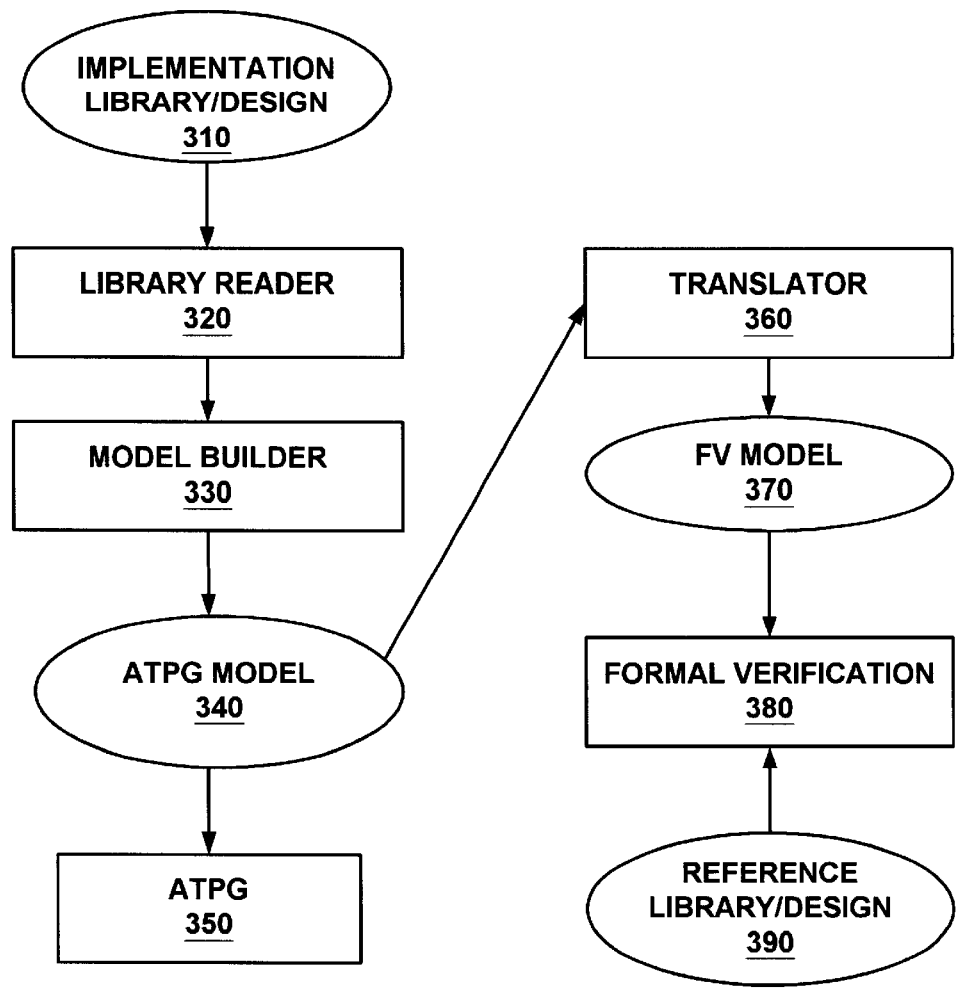
FIG. 3 illustrates an IC design flow in accordance with the present invention including an automatic process for generating gate-level and structural descriptions from table-based descriptions for formal verification.

FIG. 3 illustrates an IC design process 300 in accordance with the present invention. The library reader 320 of the present invention is a process that reads existing implementation library/design 310 and automatically extract gate-level descriptions therefrom. Often, implementation libraries/designs are described as tables in the form of user-defined primitives(UDPs). The library reader 320 first parses the UDPs and translates them into ordered ternary decision diagrams (OTDDs), based on strong Kleenean logic. A complete OTDD is built directly from combinational UDPs. A feedback-free, non-redundant gate-level network is extracted from this OTDD. A second OTDD is then extracted from the gate-level model. A local verification step checks that the two OTDDs are identical. Comprehensive rules checking is performed during the gate-extraction process, which offers significant help in modifying the table representations to eliminate errors and ambiguities and, in general, for writing a more accurate model.

With reference still to FIG. 3, a model builder 330 of the present embodiment optimizes and flattens the gate-level descriptions to create an ATPG model 340. The ATPG model 340 can be used directly by ATPG process 350. The present embodiment also provides a translator 360 that maps the primitives of the ATPG model 340 into primitives of a FV model 370. Subsequently, the FV model 370 can be formally verified against a reference library/design 390 under a formal verification process 380. It should be appreciated that methods and systems for mapping primitives of an ATPG model into primitives of a FV model and formal verification processes (e.g., FV process 380) are well known in the art and are therefore not described herein in detail to avoid obscuring aspects of the present invention.

Methods and systems for automatic generation of gate-level descriptions from table-based descriptions for electronic design automation have been described in prior-noted co-pending U.S. patent application Ser. No., 09/052,998 now U.S. Pat. No. 6,148,436 entitled "System and Method For Automatic Generation of Gate-Level Descriptions From Table-Based Descriptions For Electronic Design Automation." The methods and systems described therein, while useful for generating accurate gate-level models for ATPG, may, in certain cases, fail to generate gate-level models that are optimized for FV. As mentioned, complex UDPs may require creative translation which results in a model that is suitable for ATPG but unfit for FV. Accordingly, the present invention provides an enhanced library reader 320 and model builder 330 that are capable of automatically detecting library cell complexities that would require different ATPG and FV models. Further, the library reader 320 and model builder 330 of the present invention also generates a model that is augmented with extra information, or, in some cases, changed in minor ways to accommodate for different ATPG and FV requirements. Library cell complexities that would require different ATPG and FV models are described in detail further below.

In accordance with one embodiment of the present invention, the translator 360 accesses the ATPG model 340 through a simple application-programming interface (API) which consists of API session commands (e.g., initialize, terminate), library reader commands (e.g., set various options, read files, inspect modules read), model builder commands (e.g., set various options, build model, inspect model primitives), and rule commands (e.g., set severity, inspect violations). These commands fully control the processes by which the ATPG model is obtained, through settings and rules.

ACCOMMODATING DIFFERENCES BETWEEN ATPG MODELS AND FORMAL VERIFICATION MODELS

The present invention provides a method and system for constructing structural gate-level models that are fit for both ATPG and FV. Particularly, in accordance with one embodiment of the invention, the library reader and the model builder automatically detects logic complexities that may cause the model to be unsuitable for either ATPG or FV, and augments the model such that it can be read by both ATPG and FV tools. More particularly, in one embodiment, the library reader and the model builder eliminates unused circuitry, translates primitive strengths and extracts clock dominance. Further, the model builder propagates tied values, replaces equivalent latches and flip-flops and produces an optimized ATPG model.

A. Functionally-Unused Circuitry

The presence of unused circuitry generally does not impact ATPG. However, the presence of unused circuitry in a model may cause a failure in FV. Hence, according to one embodiment of the present invention, the library reader 320 and model builder 330 eliminate unused circuitry during construction of ATPG model 340. At the same time, rule violations (e.g., typically warnings) are issued for formal verification if the library or netlist data is incomplete (e.g., ports of a cell are unused).

In some cases, library cells contain clouds of combinational logic used only for timing checks, e.g., within Verilog's specify . . . endspecify section. Thus, according to an embodiment of the present invention, the library reader 320 parses the specify block and detects the connectivity of all structural and UDP-extracted gates that fan-out only to timing variables. These gates are eliminated by the library reader from the final model. All potential rule violations associated with removed gates are also suppressed.

Library cells, especially UDPs, often include extra circuitry to detect simulation assertion failures (e.g., failed timing checks). When such condition is detected, the latches and flip-flops are set to X (unknown value). This logic is functionally unused, not implemented in silicon and often even physically unrealizable. In the present embodiment, all gates and rule violations in this category are also removed by library reader 320 and model builder 330.

Some functionally unused UDPs may be removable only if it is connected to other functionally unused circuitry. For example, if a first UDP that has no gate-level representation is defined in the library, and if the first UDP is connected to a special "X-out state" input of a second, functional UDP which represents a state element, the library reader and the model builder would not report any rule violations stemming from the failed attempt to extract the first UDP into gates. In this way, the ATPG model generated would contain only functional circuits and would therefore be usable by formal verification.

B. Strengths and Combined Signals

Verilog uses five different signal strengths plus three different charge strengths for the logical values of 0 and 1. Z is the lowest strength and X represents any possible range of unknown strengths across the 0-1 border. However, for ATPG, signal values are represented as 0, 1, resistive 0, resistive 1, Z and X, where X is any unknown value. Exemplary Verilog strengths and their corresponding ATPG mapping are shown in Table 1.

TABLE 1

| Verilog strength | ATPG mapping |
| --- | --- |
| 7 (supply) | normal 0, 1 |
| 6 (strong) | |
| 5 (pull) | resistive 0, 1 |
| 4 (large) | |
| 3 (weak) | |
| 2 (medium) | |
| 1 (small) | |
| 0 (highz) | Z |
| X | X |

Strengths are significant when two or more primitives drive the same net. For ATPG, if there are multiple drivers on a net, its value is determined by a WIRE primitive or BUS primitive as a function of all net drivers. If the net can be tri-stated, a BUS primitive is used; if it cannot be tri-stated, a WIRE primitive is used. The output of a resistive ATPG primitive can influence the value of the net only if no normal value is driven onto the net. Therefore, the ATPG modeling of signal strengths can be fully represented by a "weak" attribute on selected BUS inputs. For example, if a strength-6 Verilog AND primitive and a strength-3 OR primitive drive net "a", the corresponding ATPG model would be a WIRE primitive with a normal input driven by an AND gate, a weak input driven by an OR gate and an output that drives net "a".

Collapsing the eight strengths of Verilog into three levels for ATPG provides a very efficient model, with all strength information limited to a few BUS primitives' inputs. This model, however, cannot represent the weak values in some designs with cascaded pass devices. This problem is illustrated by the Verilog model 400 in FIG. 4 and its corresponding ATPG model 500 in FIG. 5.

Figure 5:
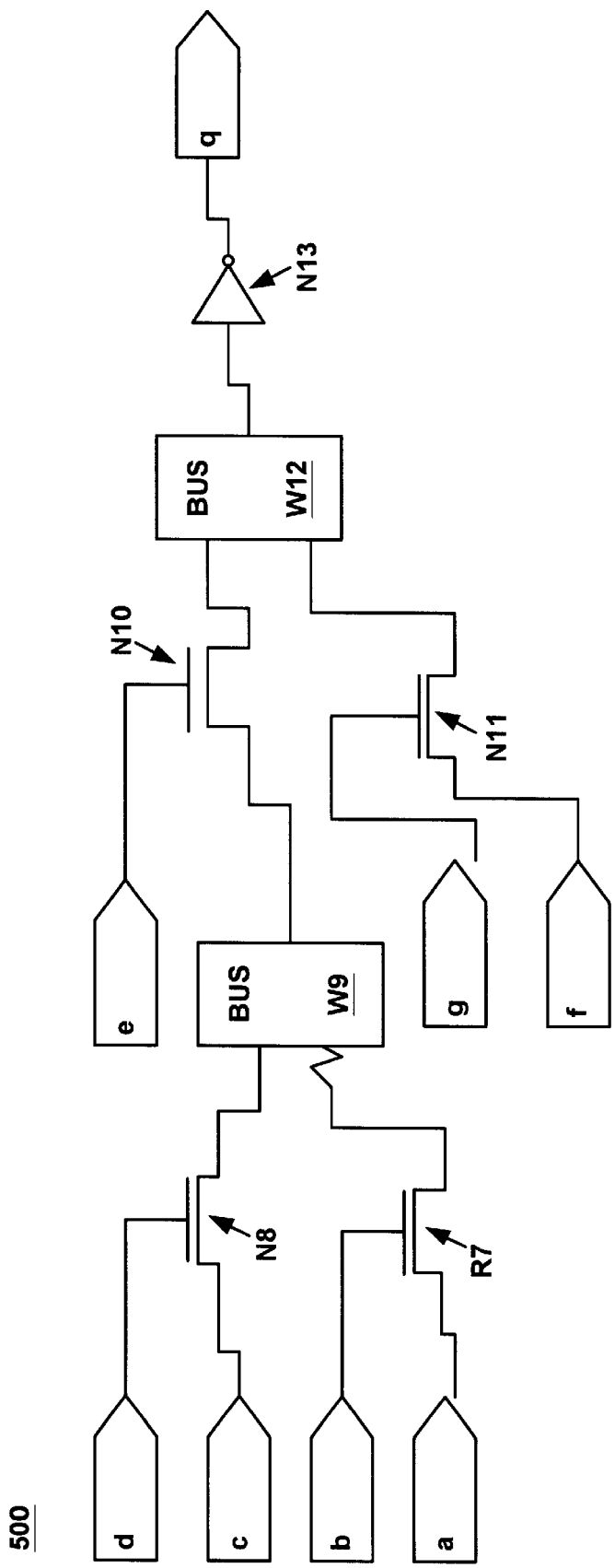
FIG. 5 illustrates an ATPG model of a circuit described by Verilog description of FIG. 4 and on which embodiments of the present invention may be practiced.

As illustrated in FIG. 5, if RNMOS R7 drives net W9 while NMOS N8 is tri-stated, then NMOS N10 should propagate a weak value onto net W12. However, as illustrated in the ATPG model 500, a strong value would be propagated to net W12. Such designs, fortunately, are rare and do not justify the additional ATPG model complexity that would be needed to represent weak values propagation. For ATPG, a warning will be issued for designs such ATPG model 500. ATPG-generated patterns will still simulate correctly on a Verilog simulator because using a strong value instead of a weak value gives conservative results. For example, for Verilog model 400 and ATPG model 500, if a=0, b=1, d=0, e=1, f=1, g=1, the ATPG-simulated value on output 14 will be X, while the Verilog-simulated value will be 0.

Formal verification, however, requires identity between models including signal strength information. ATPG strength mapping would give rise to inaccurate results. Therefore, according to one embodiment of the present invention, full strength information is added to every gate, but the model built remains exactly the same. Significantly, the library reader 320 of the present embodiment stores both Verilog strength values and their corresponding ATPG strength values within every gate of the ATPG model (e.g., model 340). The full strength values (e.g., the Verilog strength values) are used by FV, and the ATPG strength values are used by ATPG. To avoid adding memory to the ATPG model, the strength information is kept in a shared space on the structure of a primitive: FV uses the shared space for storing strength values, whereas ATPG uses the same space for test generation.

C. Clock Dominance in Latches and Flip-Flops

As described in prior-noted co-pending U.S. Patent Application entitled, "System and Method For Automatic Generation of Gate-Level Descriptions From Table-Based Descriptions For Electronic Design Automation," sequential UDPs are translated into one or more latch or flip-flop ATPG primitives (DLAT or DFF) connected to a feedback-free network of Boolean gates. In most cases, the extracted gate-level model is useable by both ATPG and FV. However, some UDPs include clock dominance information. That is, when more than one clock are active the output of a state element is influenced by only one of the active clocks. Several types of clock dominance may be present in an implementation library (e.g., library 310): (a) set/reset dominance over reset/set; (b) set/reset dominance over other clocks; (c) clock dominance over set/reset; (d) dominance between clocks; and (e) gated clocks dominance of all types above.

ATPG patterns never activate more than one clock at a time. Therefore, ATPG models are optimized by minimizing the number of gates and removing any dominance information, e.g., pessimistically asserting that the output becomes X when two or more clocks conflict in their captured data. For example, if set and reset are active, the output becomes X.

Formal verification, however, requires an exact model that includes clock dominance information. Therefore, in accordance with one embodiment of the present invention, the library reader 320 has the capability to detect clock dominance from the UDP table and record the information as attributes on the ports of the DLAT or DFF primitives. After the clock dominance information is extracted from the table-based descriptions, the library reader 320 encodes this information in a way such that it is passed on by the model builder 330. In other words, the clock dominance information is preserved when the model builder 330 transforms the extracted gate-level descriptions into ATPG model 340. The clock dominance information is then passed onto the translator 360 which introduces this information into the FV model 370 to be used by FV processes 380.

Figure 6:
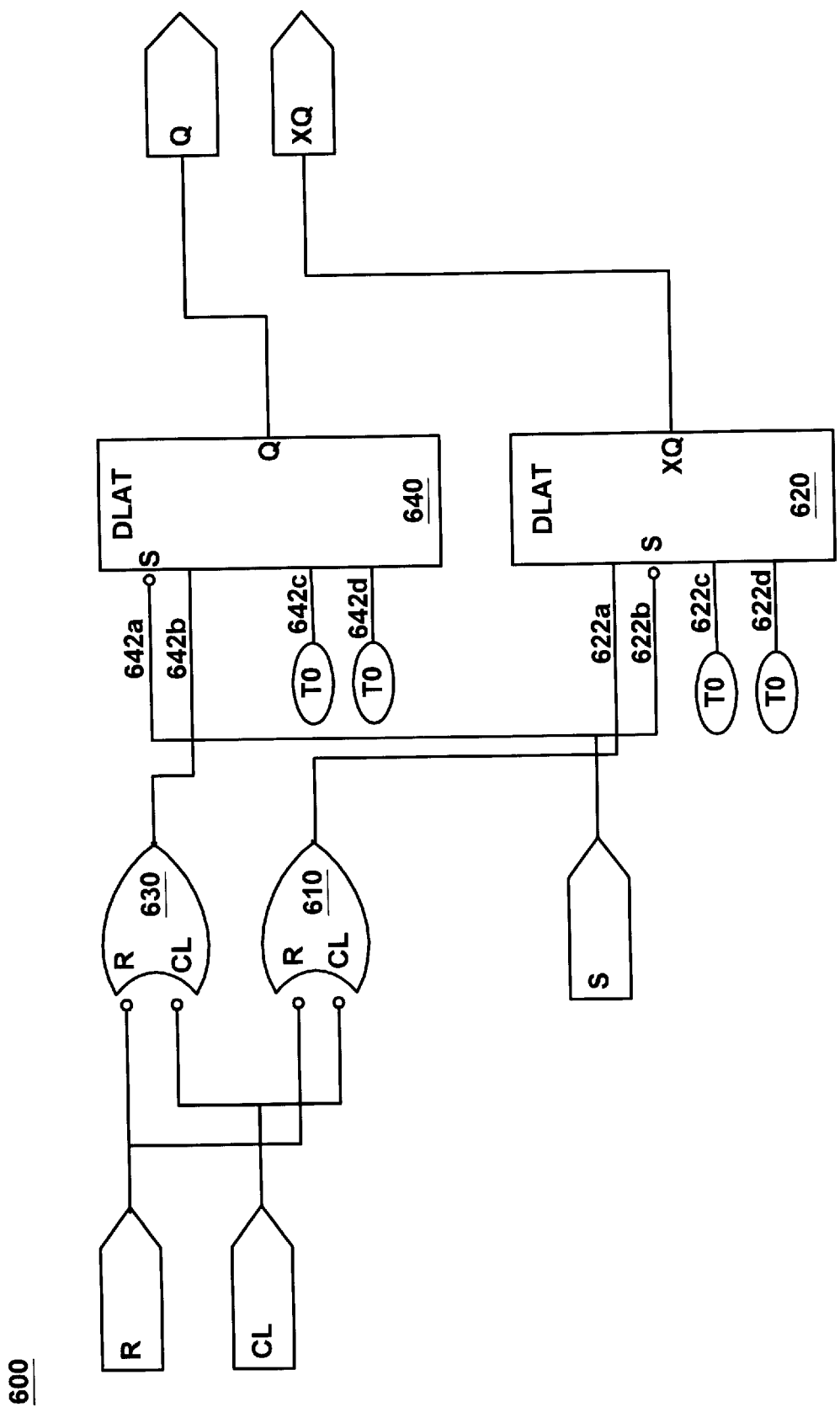
FIG. 6 illustrates an exemplary ATPG model that has gated clocks dominance and on which embodiments of the present invention may be practiced.

Detecting clock dominance from the UDP table, in most cases, is quite straightforward. However, if the clocks are gated, detection of clock dominance may become more difficult. An exemplary model 600 including gated clocks is illustrated in FIG. 6. Model 600 is defined as a Verilog module that instantiates two UDPs. In furtherance of one embodiment of the present invention, the first UDP is extracted into OR gate primitive 610 and DLAT primitive 620. One input of primitive 610 is coupled to (inverted) signal R and another input is coupled to (inverted) signal CL. DLAT primitive 620 has four inputs 622a–622d (set, reset, clock, data) and an output XQ. Input 622a is coupled to the output of primitive 610; and, input 622b is coupled to (inverted) signal S. Inputs 622c–622d are tied to 0 (unused). The table description of the first UDP defines input 622b as dominant over other inputs. Thus, the library reader 320 marks the second input of DLAT 620 as dominant. In furtherance of the present embodiment, the second UDP is extracted into OR gate primitive 630 and DLAT primitive 640. One input of primitive 630 is coupled to (inverted) signal R and another input is coupled to (inverted) signal CL. DLAT primitive 640 has four inputs 642a –642d (set, reset, clock, data) and an output Q. Input 642a is coupled to (inverted) signal S; and, input 642b is coupled to the output of primitive 630. If the table description of the second UDP indicates inputs R and CL as dominant over input S, the library reader 320 propagates the dominance through the OR gate primitive 630 and marks the second input 642b of DLAT 640 as dominant. This information is then passed on to the translator to be used during formal verification.

D. Model Optimizations

Several optimizations are performed on the model built to reduce primitive count and simplify the model. These transformations are specifically targeted towards an optimal ATPG model and could produce a model unfit for FV. Therefore, the library reader 320 and the model builder 330 of the present embodiment is configured for performing optimizations and/or transformation to the model built to produce a model that is fit for both ATPG and FV.

D.1 Equivalent DLAT/DFF Elimination

Figure 7:
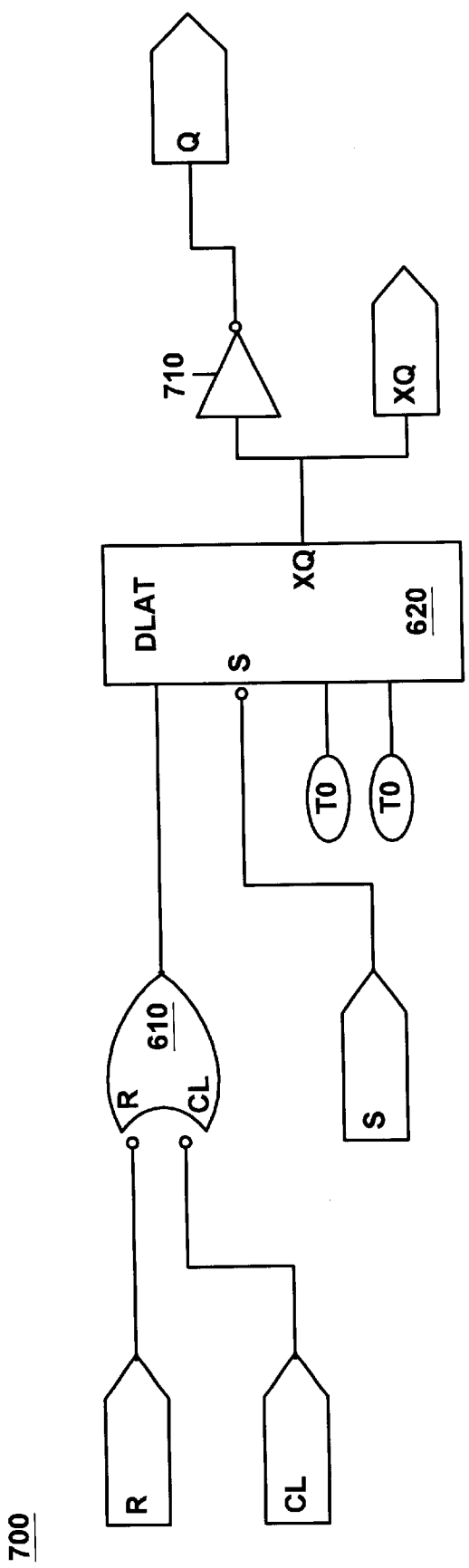
FIG. 7 illustrates a simplified ATPG model of FIG. 6 where equivalent latches are eliminated or replaced in accordance with one embodiment of the present invention.

According to one embodiment of the present invention, in order to optimize for ATPG, model builder 330 detects pairs of latches or flip-flops that always have dependent outputs. For example, as illustrated in FIG. 6, the set input 642a of DLAT 640 always has the same value as the reset input 622b of DLAT 620. This is because input 642a and 622b are both driven by input S. Furthermore, OR gate primitives 610 and 630 always have the same input and output values. Thus, the reset input of DLAT 640 is at the same value as the set input of DLAT 620. Thus, for optimizing ATPG, the model builder simplifies the model 600 by replacing one of the DLATs with an inverter. An exemplary simplified model 700 is illustrated in FIG. 7. As shown in FIG. 7, OR gate primitive 630 and DLAT primitive 640 are replaced by an inverter 710 that is coupled to the output XQ of DLAT primitive 620.

It should be note that both set and reset inputs of the two latches 620 and 640 of FIG. 6 could be active at once (e.g., if S=0, R=0). ATPG disregards the dominance of reset over set, thus Q and XQ are both considered unknown, or X. However, unlike ATPG, FV considers dominance. Thus, in the ATPG model 600 of FIG. 6, if S=0 and R=0, then Q and XQ are both 0. In contrast, as shown in FIG. 7, if S=0 and R=0, then the outputs would be Q=1 and XQ=0. It appears that equivalent DLAT merging cannot be done in this case and the model 600 of FIG. 6 should be used for FV. But, this poses a much more serious problem: the reference model, which is usually written at the register-transfer level, may only have one latch and the implementation model (FIG. 6) has two latches, a condition that will cause formal verification of the two models to fail.

The present invention provides a solution to the aforementioned problem. While all ATPG primitives only have one output, the FV model has a two output latch primitive that supports dominance attributes. According to one embodiment of the present invention, when the model builder replaces DLAT 620 of FIG. 6 with an inverter to build the model 700 of FIG. 7, the model builder also notes the dominance of the two latches, and sets a flag on inverter 710 indicating that the inverter is special and that it has been inserted to replace a latch that was equivalent. According to the present embodiment, the translator 360 detects this flag and sets the dominance attribute on the FV-model two-output latch. In this way, the correct output values are obtained when set and reset are both active. In the same embodiment of the present invention, the translator 360 detects the flag and maps the inverter 710 to a buffer such that the FV model 370 is accurately generated.

D.2 Tie Propagation

Figure 8A:
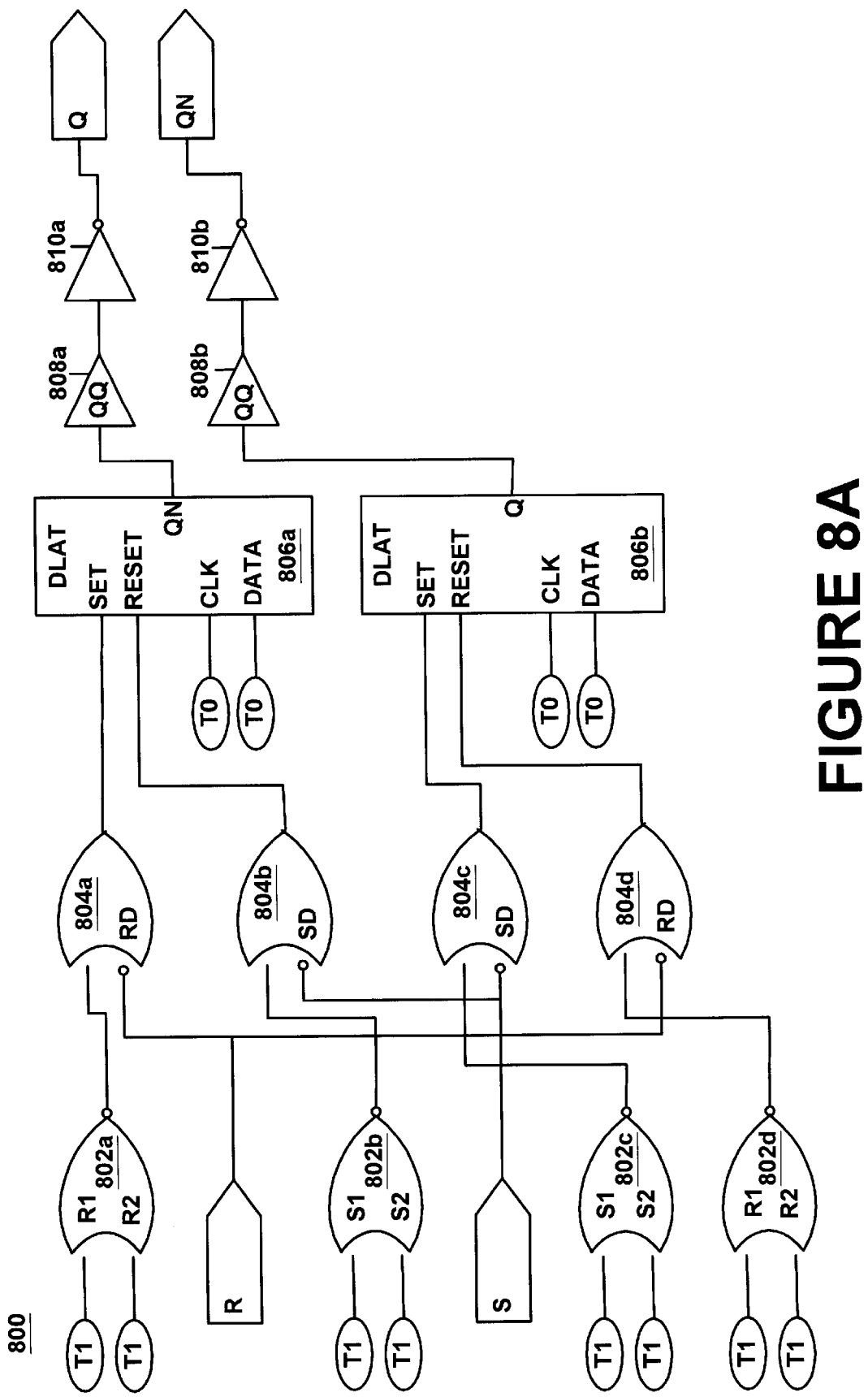
FIG. 8A illustrates an exemplary ATPG model before tie propagation and before equivalent latches elimination in accordance with one embodiment of the present invention.
Figure 8B:
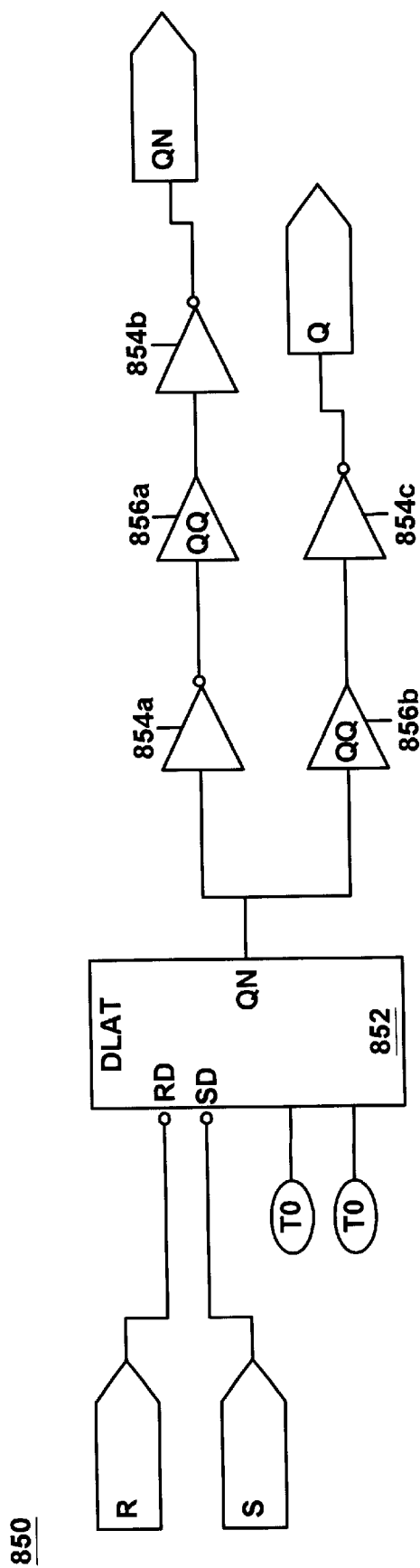
FIG. 8B illustrates an exemplary ATPG model after tie propagation and equivalent latches elimination in FIG. 8A in accordance with one embodiment of the present invention.

Some library models are written as a Verilog module that instantiates UDPs and perhaps also Verilog primitives and connects some inputs to tied values (e.g., 0 or 1). ATPG easily recognizes tied primitive inputs and wastes no effort in justifying logic values on tied primitives. However, tied inputs result, in some case, in equivalent latches. An exemplary ATPG model 800 before tie propagation is illustrated in FIG. 8A. Specifically, ATPG model 800 includes four NOR gate primitives 802a–802d, four OR gate primitives 804a–804d, two DLAT primitives 806a–806b, two buffer primitives 808a–808b and two inverter primitives 810a–810b. Significantly, as shown in FIG. 8A, the inputs of NOR gate primitives 802a–802d are tied to 1; and, CLK and DATA inputs of DLAT primitives 806a–806b are tied to 0. A simplified ATPG model 850 after tie propagation is illustrated in FIG. 8B. As illustrated, simplified ATPG model 850 includes a DLAT primitive 852, inverter primitives 854a–854c and buffer primitives 856a–856b.

As illustrated in FIGS. 8A and 8B, propagating tied values results in primitive elimination and equivalent latches, thus a much reduced model. In this case, tie propagation results in faultable pins lost, thus this optimization should not be performed for a regular test generation run. However, according to the present invention, the model builder (e.g., model builder 330) performs tie propagation before identifying and eliminating equivalent latches. According to the present invention, performing tie propagation prior to elimination of equivalent latches is crucial for FV. In the example illustrated in FIGS. 8A and 8B, performing tie propagation eliminates the NOR gate primitives 802a–802d and OR gate primitives 804a–804d, and reveals the equivalence between DLAT primitives 806a–806b. However, the model builder 330 would fail to discover equivalency between DLAT primitives 806a–806b if tie propagation has not been performed. Accordingly, in the present embodiment, the model builder 330 performs tie propagation before equivalent latch elimination.

D.3 Level-sensitive (LS) Port vs. Set/Reset (S/R) Usage

Figure 9:
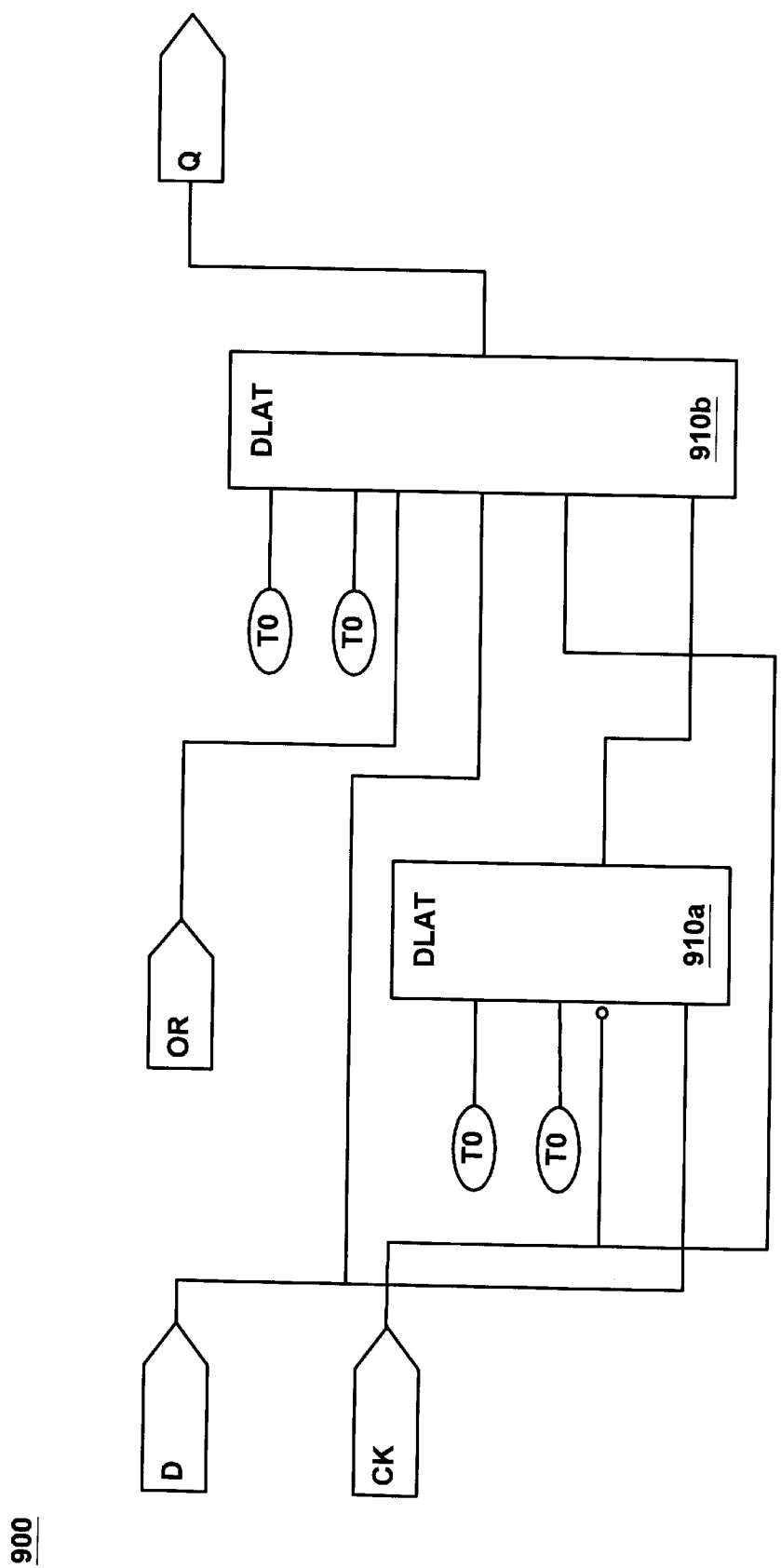
FIG. 9 illustrates an exemplary ATPG model that is suitable for ATPG but unsuitable for formal verification in accordance with an embodiment of the present invention.

In some cases, UDPs are written to represent a complex state element with an edge clock port and a level-sensitive clock port. This is common in certain scan designs where scan cells have an edge-triggered functional port and a level-sensitive scan port. Because ATPG primitives only allow all clock ports to be of the same kind (LS for DLAT, edge for DFF), the library reader produces an ATPG model with two DLATs. An ATPG model 900 having two DLATs is illustrated in FIG. 9. As illustrated, edge-triggered clock CK captures data D and level-sensitive clock OR also captures D. The edge-triggered effect is realized by cascading DLAT 910a and DLAT 910b. DLAT 910a is clocked with the inverted CK and DLAT 910b is clocked with CK and capturing the output of DLAT 910a. Based on the UDP table, level-sensitive clock OR dominates the other clock port of DLAT 910b.

Consider now the following sequence of events:
(1) CK=0, D=0, OR=1→DLAT 910a=0, Q=0;
(2) CK: 0→1→DLAT 910a=0, Q=0;
(3) D: 0→1→DLAT 910a=0, Q=1;
(4) OR: 1→0→DLAT 910a=0, Q=0.

The last event shows a mismatch between the model and the UDP table: the output Q should not change as a result of level-sensitive clock OR going inactive. Interestingly, this is not a real problem for ATPG, because ATPG patterns will only pulse one clock at the time and will return edge clock CK to its off-state of 0 before events (3) and (4).

Figure 10:
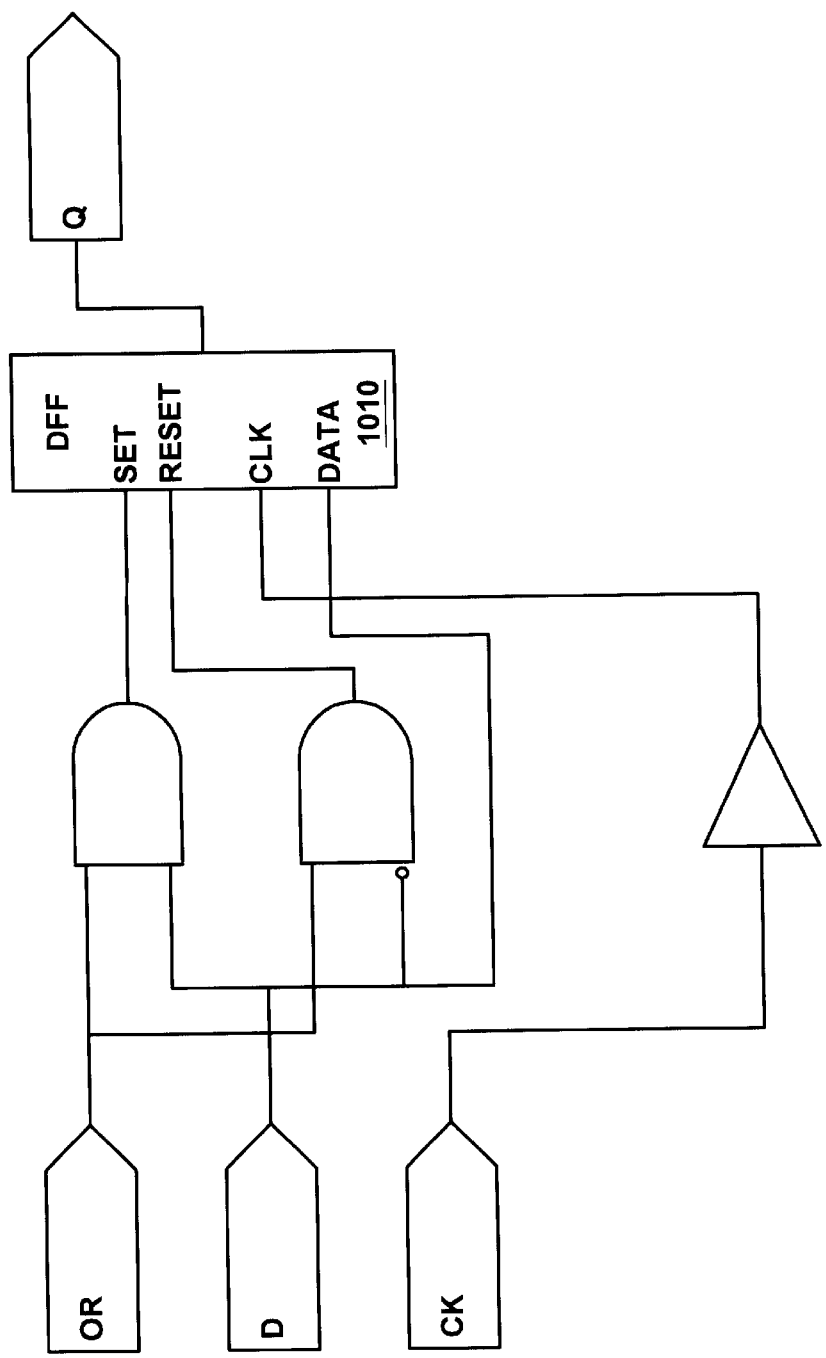
FIG. 10 illustrates an exemplary gate-level model that is suitable for formal verification but unsuitable for ATPG in accordance with an embodiment of the invention.

However, ATPG model 900 is not an acceptable model for FV because it has two state elements and the reference model has only one. An exemplary model 1000 that is acceptable to FV is illustrated in FIG. 10. As illustrated in FIG. 10, DLAT primitives having level-sensitive ports are not present. Rather, model 1000 includes a DFF primitive 1010 with level-sensitive set and reset inputs. Model 1000 correctly gives output Q=1 when presented with the sequence of events analyzed above. Unfortunately, model 1000 is not acceptable to ATPG because input D is connected to both set, reset and the data input of the DFF primitive 1010, which would cause rules checking failures due to possible inaccuracies of ATPG's 0-delay combinational simulation.

Figure 11:
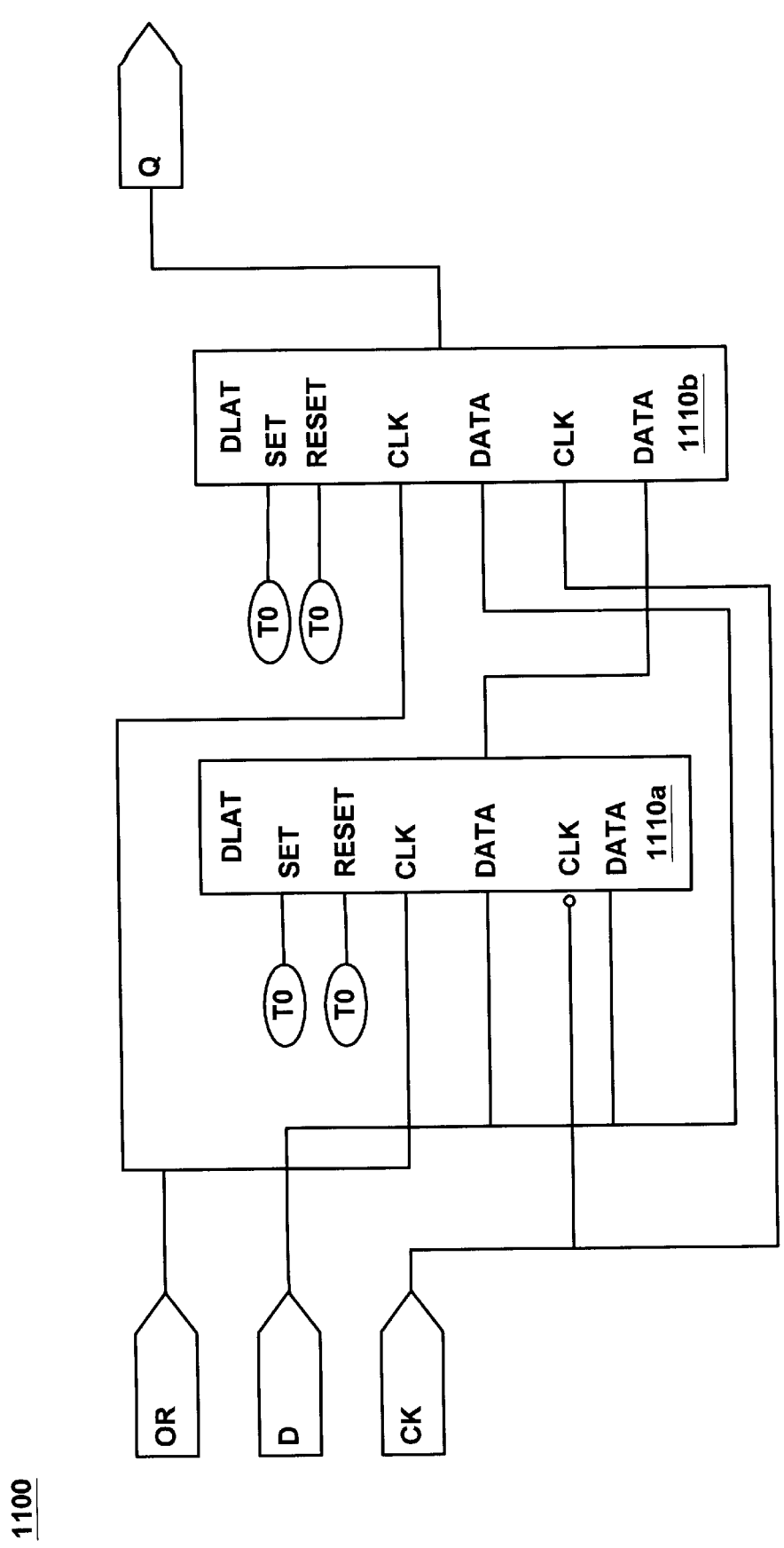
FIG. 11 illustrates an exemplary ATPG model that is suitable for both ATPG and formal verification in accordance with one embodiment of the present invention.

According to the present invention, a simple variation of the ATPG model 900 would solve this dilemma. An exemplary ATPG model 1100 that is fit for both ATPG and FV is illustrated in FIG. 11. ATPG model 1100, as illustrated, includes DLAT primitives 1110a–1110b. DLAT primitives 1110a–1110b are both coupled to receive level-sensitive clock OR and edge-triggered clock CK. The only difference between ATPG model 900 and ATPG model 1100 is that, in the latter model, OR and D are also inputs to the DLAT primitive 1110a. These extra inputs are unnecessary, except for the sequence of events analyzed above, in which case the correct output is produced.

The present invention, methods and system for extracting gate description models from simulation tables for formal verification, has thus been disclosed. The present invention allows implementation libraries containing table-based cells (UDPs) to be automatically read in and extracted to generate gate-level models that are useable by both ATPG and FV. While the present invention has been described in particular embodiments, it should be appreciated that the present invention should not be construed as limited by such embodiments, but should be construed according to the claims below.

What is claimed is:

1. A computer implemented method of automatically generating gate-level models of circuit cells for formal verification, said method comprising the steps of:
   a) accessing an implementation library to obtain a table-based description of a circuit cell;
   b) constructing a first gate-level model of said circuit based on said table-based description wherein said first gate-level model is adapted for automatic test pattern generation; and
   c) translating said first gate-level model into a second gate-level model that is adapted for formal verification.

2. A computer implemented method as recited in claim 1 wherein said implementation library comprises Verilog signal strength values.

3. A computer implemented method as recited in claim 2 wherein said step (b) comprises the steps of:
   mapping said Verilog signal strength values to ATPG signal strength values; and
   storing said Verilog signal strength values and said ATPG signal strength values as part of said first gate-level model.

4. A computer implemented method as recited in claim 1 wherein said step (b) comprises the step of eliminating non-functional constructs such that said first gate-level model does not contain unused circuitry.

5. A computer implemented method as recited in claim 1 wherein said step (b) comprises the step of extracting clock dominance information from said table-based description, wherein said clock dominance information is stored as part of said first gate-level model for use by formal verification.

6. A computer implemented method as recited in claim 1 wherein said step (b) comprises the steps of:
   propagating tie values;
   after said step of propagating, eliminating equivalent latches of said first gate-level model.

7. A computer implemented method as recited in claim 6 wherein said step of eliminating comprises a step of replacing a latch with a special inverter, wherein said special inverter is mapped to a buffer primitive of said second gate-level model during said step (c).

8. A computer readable medium containing therein computer readable codes that is capable of causing a computer implemented electronic design automation (EDA) system to perform a method of automatically generating gate-level models of circuit cells for use in formal verification, said method comprising the steps of:
   a) accessing an implementation library to obtain a table-based description of a circuit cell;
   b) constructing a first gate-level model of said circuit based on said table-based description wherein said first gate-level model is adapted for automatic test pattern generation; and
   c) translating said first gate-level model into a second gate-level model that is adapted for formal verification.

9. A computer readable medium as recited in claim 8 wherein said implementation library comprises Verilog signal strength values.

10. A computer readable medium as recited in claim 9 wherein said step (b) of said method comprises the steps of:
    mapping said Verilog signal strength values to ATPG signal strength values; and
    storing said Verilog signal strength values and said ATPG signal strength values as part of said first gate-level model.

11. A computer readable medium as recited in claim 8 wherein said step (b) of said method comprises the step of eliminating non-functional constructs such that said first gate-level model does not contain unused circuitry.

12. A computer readable medium as recited in claim 8 wherein said step (b) of said method comprises the step of extracting clock dominance information from said table-based description.

13. A computer readable medium as recited in claim 8 wherein said step (b) comprises the steps of:
    propagating tie values; and
    after said step of propagating, eliminating equivalent latches of said first gate-level model.

14. A computer readable medium as recited in claim 13 wherein said step of eliminating comprises the step of replacing a latch with a special inverter wherein said special inverter is mapped to a buffer primitive of said second gate-level model during said step (c).

15. An electronic design automation system comprising:
    a library reader for accessing a table-based description of a circuit cell contained within an implementation library and extracting a gate-level description therefrom;
    a model builder for constructing a first gate-level model based on said gate-level description wherein said first gate level model is adapted for automatic test pattern generation;
    a translator for translating said first gate-level model into a second gate-level model that is adapted for formal verification.

16. An electronic design automation system as recited in claim 15 further comprising an automatic test pattern generation tool adapted for generating test patterns from said first gate-level model.

17. An electronic design automation system as recited in claim 15 further comprising a formal verification tool for comparing said second gate-level model with a circuit cell contained within a reference library.

18. An electronic design automation system as recited in claim 15 wherein said library reader is adapted for accessing Verilog signal strength values of said circuit cell, mapping said Verilog signal strength values to ATPG signal strength values; and storing said Verilog signal strength values and said ATPG signal strength values as part of said first gate-level model.

19. An electronic design automation system as recited in claim 15 wherein said model builder is adapted for eliminating non-functional constructs such that said first gate-level model does not contain unused circuitry.

20. An electronic design automation system as recited in claim 15 wherein said model builder is adapted for extracting clock dominance information from said table-based description, wherein said clock dominance information is stored as part of said first gate-level model for use by formal verification.

21. An electronic design automation system as recited in claim 15 wherein said model builder is adapted for propagating tie values, and for replacing an equivalent latch with a special inverter after tie propagation, wherein said special inverter is mapped to a buffer primitive of said second gate-level model by said translator.

* * * * *